US 10,582,580 B2

(12) United States Patent
Meiser et al.

(10) Patent No.: US 10,582,580 B2
(45) Date of Patent: Mar. 3, 2020

(54) SWITCH COMPRISING A FIELD EFFECT TRANSISTOR AND INTEGRATED CIRCUIT

(71) Applicant: Infineon Technologies AG, Neubiberg (DE)

(72) Inventors: Andreas Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 823 days.

(21) Appl. No.: 15/139,800

(22) Filed: Apr. 27, 2016

(65) Prior Publication Data
US 2016/0322347 A1 Nov. 3, 2016

(30) Foreign Application Priority Data
Apr. 29, 2015 (DE) .......................... 10 2015 106 688

(51) Int. Cl.
*H02M 3/156* (2006.01)
*H05B 33/08* (2020.01)
(Continued)

(52) U.S. Cl.
CPC ....... *H05B 33/083* (2013.01); *H01L 27/0886* (2013.01); *H02M 1/088* (2013.01); *H02M 3/156* (2013.01)

(58) Field of Classification Search
CPC .. H05B 33/083; H01L 27/0886; H02M 1/088; H02M 3/156
(Continued)

(56) References Cited

U.S. PATENT DOCUMENTS 4,738,936 A * 4/1988 Rice .................... H01L 29/1095
257/386
5,365,102 A * 11/1994 Mehrotra ............. H01L 29/872
257/471
(Continued)

FOREIGN PATENT DOCUMENTS

CN 101140950 A 3/2008
DE 102015117862 A1 5/2016
(Continued)

OTHER PUBLICATIONS

Office Action communication of the Korean Patent and Trademark Office for Appln. Ser. No. 1020160053140, dated Apr. 29, 2016.
(Continued)

*Primary Examiner* — Chee-Chong Lee
(74) *Attorney, Agent, or Firm* — Slater Matsil, LLP

(57) ABSTRACT

A switch comprises a field effect transistor in a semiconductor substrate having a first main surface. The field effect transistor comprises a source region, a drain region, a body region, and a gate electrode at the body region, the gate electrode being configured to control a conductivity of a channel formed in the body region. The gate electrode is disposed in gate trenches. The body region is disposed along a first direction between the source region and the drain region, the first direction being parallel to the first main surface. The body region has a shape of a ridge extending along the first direction. The body region is adjacent to the source region and the drain region. The switch further comprises a source contact and a body contact portion, the source contact being electrically connected to a source terminal. The body contact portion is in contact with the source contact and is electrically connected to the body region.

25 Claims, 8 Drawing Sheets

(51) Int. Cl.
*H01L 27/088* (2006.01)
*H02M 1/088* (2006.01)

(58) Field of Classification Search
USPC .......................................................... 239/509
See application file for complete search history.

(56) References Cited

U.S. PATENT DOCUMENTS

| | | | | |
|---|---|---|---|---|
| 5,378,912 | A | * | 1/1995 | Pein .................... H01L 29/1608 257/335 |
| 5,548,150 | A | * | 8/1996 | Omura .................. H01F 41/046 257/339 |
| 5,559,044 | A | * | 9/1996 | Williams ............ H01L 21/8249 148/DIG. 126 |
| 6,118,149 | A | | 9/2000 | Nakagawa et al. |
| 7,883,949 | B2 | * | 2/2011 | Das ....................... H01L 21/046 257/E21.043 |
| 8,674,440 | B2 | * | 3/2014 | Korec ................. H01L 21/8234 257/341 |
| 2008/0061320 | A1 | | 3/2008 | von Kluge et al. |
| 2008/0094000 | A1 | | 4/2008 | Yamamoto |
| 2009/0026537 | A1 | | 1/2009 | Hashitani |
| 2011/0204437 | A1 | | 8/2011 | Matsunaga |
| 2012/0175634 | A1 | | 7/2012 | Weis |
| 2014/0264573 | A1 | | 9/2014 | Kocon |
| 2016/0126243 | A1 | | 5/2016 | Weis |
| 2016/0308044 | A1 | | 10/2016 | Meiser et al. |

FOREIGN PATENT DOCUMENTS

| | | |
|---|---|---|
| DE | 102016106848 A1 | 10/2016 |
| JP | 2009-541994 | 11/2009 |
| KR | 2013-0132523 | 12/2013 |
| KR | 2015-0040999 | 4/2015 |
| WO | 2014/086479 A1 | 6/2014 |

OTHER PUBLICATIONS

Office Action communication of the Korean Patent and Trademark Office for Appln. Ser. No. 2016-0053140, dated Oct. 25, 2017.
Office Action communication of the German Patent and Trademark Office for Appln. Ser. No. 102015106688.2, dated Jan. 22, 2016.

* cited by examiner

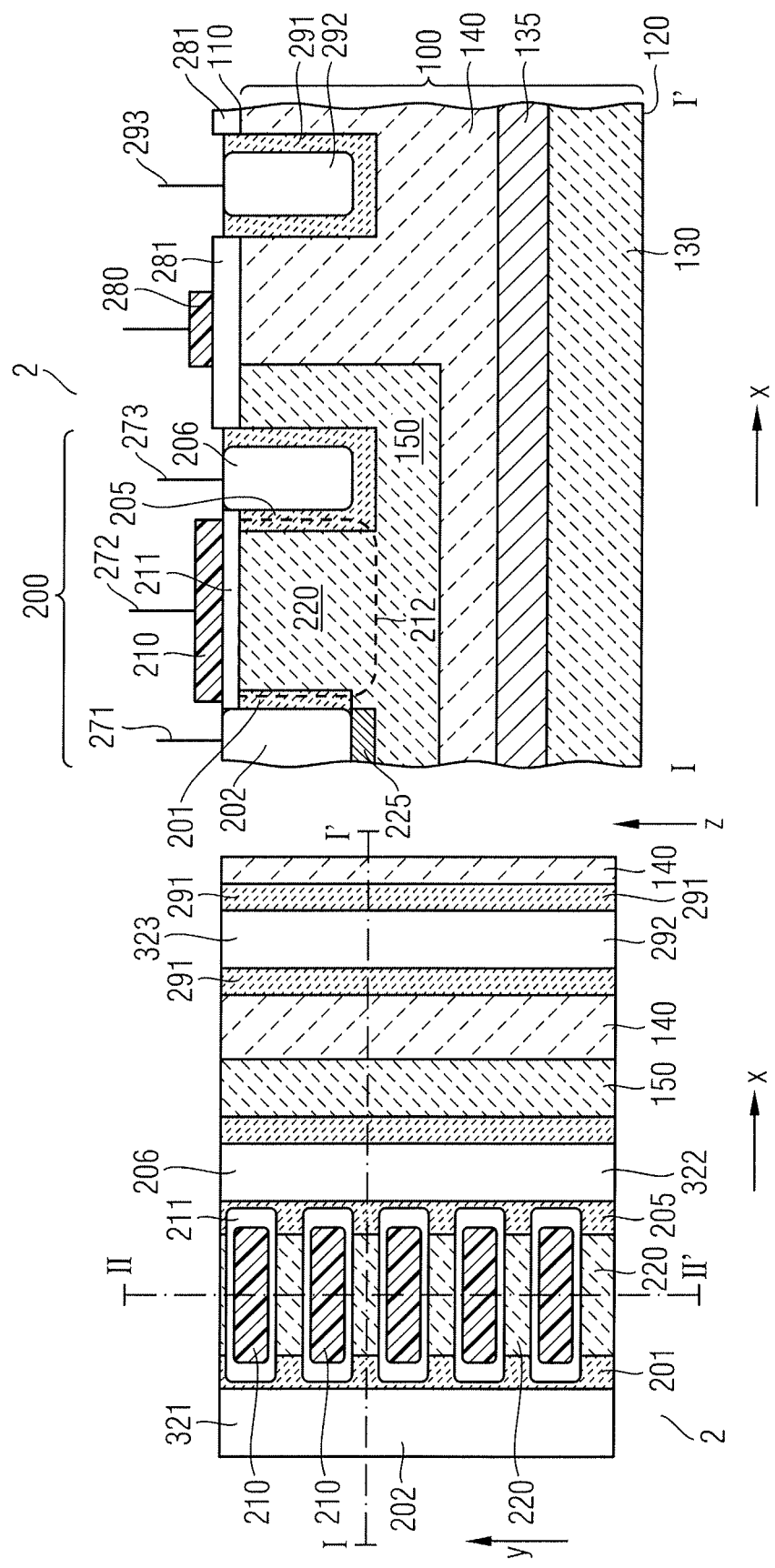

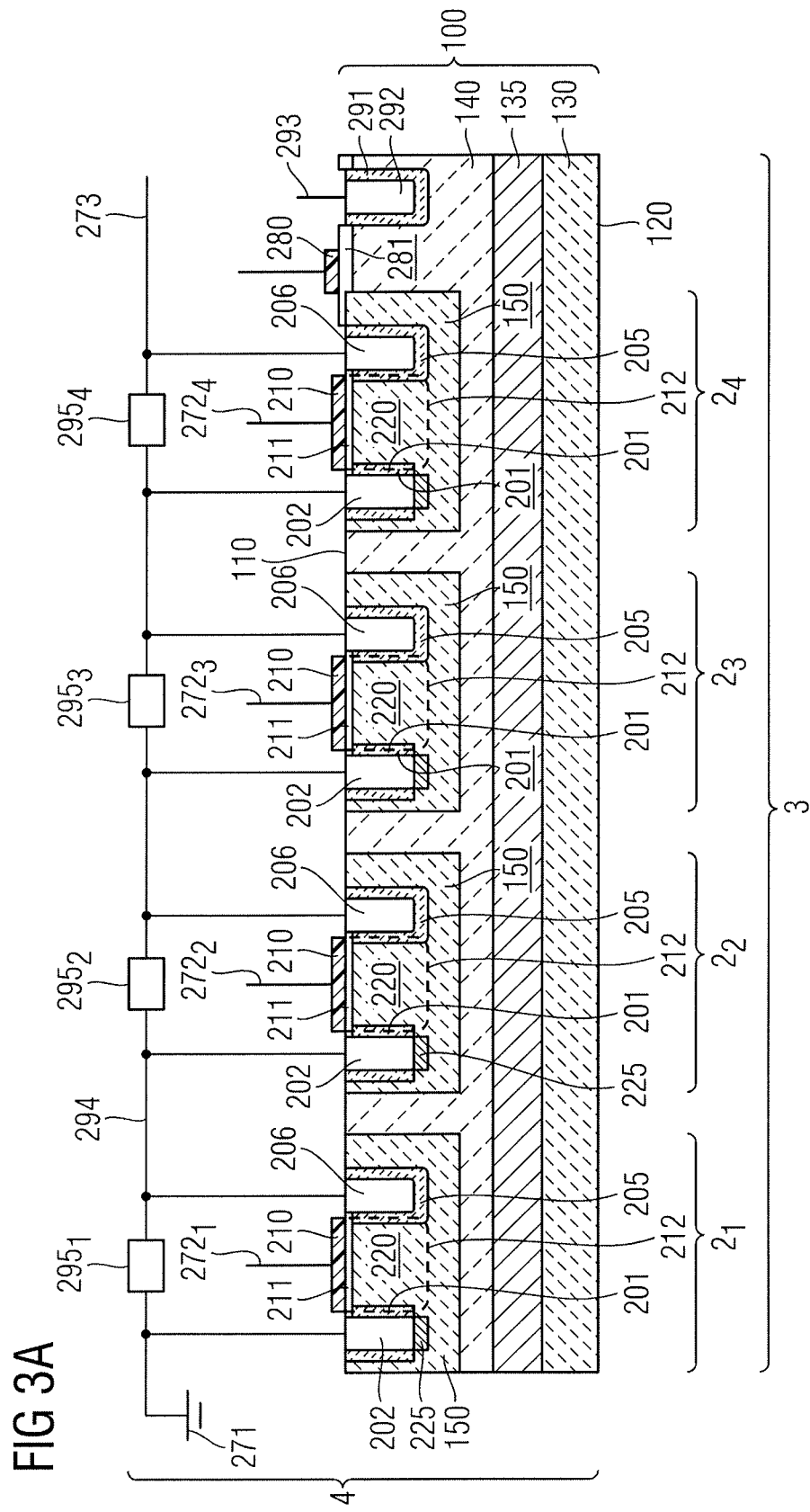

SWITCH COMPRISING A FIELD EFFECT TRANSISTOR AND INTEGRATED CIRCUIT

CROSS-REFERENCE TO RELATED APPLICATION

This application claims priority to German Application Serial No. 102015106688.2 filed Apr. 29, 2015 and entitled "Switch Comprising a Field Effect Transistor and Integrated Circuit".

BACKGROUND

Power transistors commonly employed in automotive and industrial electronics require a low on-state resistance (Ron A), while securing a high voltage blocking capability. For example, a MOS ("metal oxide semiconductor") power transistor should be capable, depending upon application requirements, to block drain to source voltages Vds of some tens to some hundreds or thousands of volts. MOS power transistors typically conduct very large currents which may be up to some hundreds of Amperes at typical gate-source voltages of about 2 to 20 V. Low-voltage power transistors are applied in a drain to source voltage range Vds below 10 Volts.

Lateral power devices, in which a current flow mainly takes place parallel to a first main surface of a semiconductor substrate, are useful for integrated circuits in which further components, such as switches, bridges and control circuits are integrated. Generally, switches comprising a lateral transistor are further investigated. In particular, it is desirable to investigate transistors which may be integrated with a driver circuit.

Accordingly, it is an object of the present invention to provide an improved switch, an improved integrated circuit and an improved system meeting the above-defined demands.

SUMMARY

According to an embodiment, a switch comprises a field effect transistor in a semiconductor substrate having a first main surface. The transistor comprises a source region, a drain region, a body region, and a gate electrode at the body region. The gate electrode is configured to control a conductivity of a channel formed in the body region. The gate electrode is disposed in gate trenches. The body region is disposed along a first direction between the source region and the drain region, the first direction being parallel to the first main surface. The body region has a shape of a ridge extending along the first direction. The body region is adjacent to the source region and the drain region. The switch further comprises a source contact and a body contact portion. The source contact is electrically connected to a source terminal. The body contact portion is in contact with the source contact and is electrically connected to the body region.

According to an embodiment an integrated circuit comprises a plurality of switches connected in series. At least one of the switches comprises a field effect transistor in a semiconductor substrate having a first main surface. The field effect transistor comprises a source region, a drain region, a body region, and a gate electrode at the body region. The gate electrode is configured to control a conductivity of a channel formed in the body region. The gate electrode is disposed in gate trenches. The body region is disposed along a first direction between the source region and the drain region, the first direction being parallel to the first main surface. The body region has a shape of a ridge extending along the first direction. The body region is adjacent to the source region and the drain region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 10 shows a further vertical cross-sectional view of the embodiment.

FIG. 3A shows a cross-sectional view of a system according to an embodiment.

DETAILED DESCRIPTION

Figure 1C:
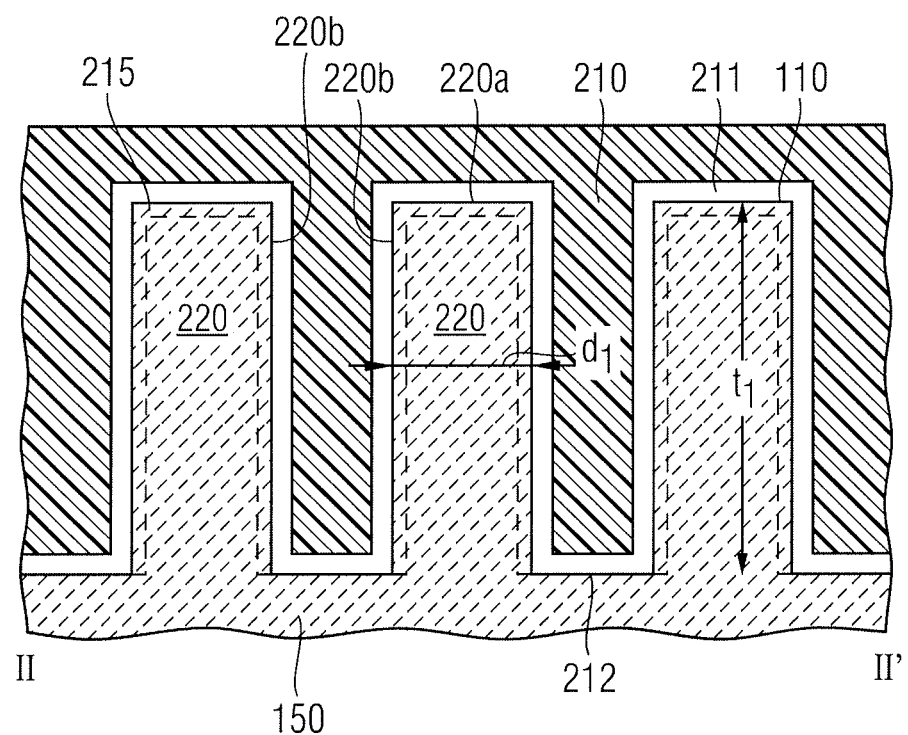
FIG. 1A shows a vertical cross-sectional view of a switch according to an embodiment.
FIG. 1B shows a horizontal cross-sectional view of a switch according to the embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As used herein, the terms "having", "containing", "including", "comprising" and the like are open ended terms that indicate the presence of stated elements or features, but do not preclude additional elements or, features. The articles "a", "an" and "the" are intended to include the plural as well as the singular, unless the context clearly indicates otherwise.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

FIG. 1A shows a vertical cross-sectional view of a semiconductor device. As will be discussed in the present specification, the semiconductor device may be a component of or may implement a switch. Further, the semiconductor device may be used in a variety of applications. The switch 2 comprises a field effect transistor 200 formed in a semiconductor substrate 100 having a first main surface 110. The field effect transistor comprises a source region 201, a drain region 205, a body region 220, and a gate electrode 210 at the body region 220. The gate electrode 210 is configured to control a conductivity of a channel formed in the body region 220. The gate electrode 210 is disposed in gate trenches 212. The position of the gate trenches 212 is indicated by dashed lines in the cross-sectional view of FIG. 1A. The gate trenches 212 are disposed before and behind the depicted plane of the drawing. The body region 220 is disposed along a first direction, e.g. the x direction, between the source region 201 and the drain region 205. The first direction is parallel to the first main surface 110.

As will be explained in more detail with reference to FIG. 10, the body region 220 has a shape of ridge extending along the first direction. The body region 220 is adjacent to the source region 201 and the drain region 205. The body region 220 contacts the source region 201 and contacts the drain region 205. For example, a drift zone may be absent from the semiconductor device. In particular, a drift zone may not be arranged between the body region and the drain region 205. The semiconductor device 1 further comprises a source contact 202 and a body contact portion 225. The source contact 202 is electrically connected to the source region 201. The body contact portion 225 may be disposed in the semiconductor substrate 100 adjacent to the source contact 202. The body contact portion 225 is electrically connected to the source contact 202 and to the body region 220.

The body region 220 may be of the first conductivity type, e.g. p-type. The source region 201 and the drain region 205 may be of the second conductivity type, e.g. n-type.

The semiconductor substrate 100 may comprise a first (bottom) layer 130 of the first conductivity type and an epitaxially grown second layer 140 of the second conductivity type formed over the first layer 130. A further buried layer 135 of the second conductivity type may be disposed between the first layer 130 of the first conductivity type and the second layer 140 of the second conductivity type. The buried layer 135 may be doped at a higher doping concentration than the second layer 140 of the second conductivity type.

The components of the field effect transistor 200 may be formed in a well of a first conductivity type, e.g. p-type. The first well region 150 may be formed in the second semiconductor layer 140 of the second conductivity type.

The second layer 140 of the second conductivity type may be contacted via a substrate contact 292. A doped portion 291 of the second conductivity type may be disposed between the substrate contact 292 and the second layer 140 of the second conductivity type. The substrate contact 292 may be electrically coupled to a contact terminal 293. The second layer 140 may be electrically connected to an appropriate potential by applying a suitable voltage to the contact terminal 293. As a consequence, the pn junction that is formed between the first well region 150 and the second layer 140 will be reverse-biased so as to insulate the first well region 150 from the buried layer 135. In particular, the field effect transistor 200 and the buried layer 135 may be very effectively insulated from each other.

As is illustrated in FIG. 1A, a pn junction between the second layer 140 and the well region 150 may be disposed adjacent to the first main surface 110 of the semiconductor substrate 100. This portion may be covered by an insulating layer portion 281. A field plate 280 may be disposed adjacent to the insulating layer 281. Thereby, electrical fields in the vicinity of the pn junction may be appropriately shaped. In particular, components above the substrate surface may be protected against electrical fields caused by the pn junction. Moreover, the pn junction is protected against electrical fields caused by components disposed over the substrate surface, such as metallization layers. In particular, a breakdown voltage may be shifted due to the presence of the field plate 280.

FIG. 1B shows a horizontal cross-sectional view of the semiconductor device 1 illustrated in FIG. 1A. The horizontal view is taken so as to intersect the gate trenches 212, the source contact 202, the drain contact 206 and the substrate contact 292. As is shown, the source contact 202, the drain contact 206 and the substrate contact 292 may be formed in respective trenches that may extend along the second direction (e.g. y direction) which is perpendicular to the first direction. The source region 201 is formed adjacent to a sidewall of a source contact trench 321 in which the source contact 202 is disposed. Further, the drain region 205 may be disposed adjacent to the sidewall and a bottom side of a drain contact trench 322, in which the drain contact 206 is disposed. The substrate contact 292 is further formed in a substrate contact trench 323. Sidewalls and the bottom side of the substrate contact trench 323 may be doped to form the doped portion 291.

FIG. 10 shows a cross-sectional view of the semiconductor device 1 between II and II', as is also illustrated in FIG. 1B. The cross-sectional view of FIG. 1C is taken so as to intersect a plurality of gate trenches 212. As is illustrated, the semiconductor material of the first conductivity type is patterned by adjacent trenches 212. Due to the patterning, separated lamellas or portions of semiconductor material forming the single ridges may be formed. The ridges comprise a top surface 220a and sidewalls 220b. A gate dielectric layer 211 is disposed adjacent to the sidewalls 220b and the top surface 220a of each of the ridges. Further, a conductive material is filled in the trenches between adjacent ridges to form the gate electrode 210. As has been explained, the body region 220 has the shape of a ridge extending in the first direction or of a fin. More particularly, the body region 220 is patterned into a ridge by adjacent trenches that extend in the first direction. The sidewalls 220b may extend perpendicularly or at an angle of more than 75° with respect to the first main surface 110. The gate electrode 210 may be disposed adjacent to at two sidewalls of the ridge. Moreover, the top surface 220a and the sidewalls 220b of the ridge may not be implemented as completely straight lines. For example, the points of intersection between the top surface 220a and the sidewalls 220b may be implemented as rounded corners. Likewise, the bottom portions of the gate trenches 212 may form rounded corners to the sidewalls 220b of the ridges.

According to an embodiment, the width dl of the ridge is dl>2×ld, wherein ld denotes a length of a depletion zone which is formed at the interface between the gate dielectric layer 211 and the body region 220. Generally, it is assumed that in a transistor, the length of the depletion zone at a gate voltage corresponding to the threshold voltage corresponds to the maximum width of the depletion zone. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material (11.9*$\varepsilon_0$ for silicon), k denotes the Boltzmann constant (1.38066*10$^{-23}$ J/K), T denotes the temperature, e.g. 293K, ln denotes the natural logarithm, $N_A$ denotes the impurity concentration of the semiconductor body, $n_i$ denotes the intrinsic carrier concentration (1.45*10$^{10}$ for silicon at 27° C.), q denotes the elementary charge (1.6*10$^{-19}$ C).

In particular, the channel regions 215 formed at opposing sidewalls 220b of a ridge may not merge with each other so that the body region 220 may be connected to the body contact portion 225 along the entire length of the body region 220. For example, the width of the trenches may be approximately 20 to 1000 nm, for example, more than 200 nm along the first main surface 110 of the semiconductor substrate 100. Further, the distance between adjacent trenches that corresponds to the width dl of the ridges may be larger than 100 nm, for example more than 130 nm, e.g. even more than 200, 300, 400 or 500 nm. According to a further embodiment, the width dl of the ridge is dl<2×ld, wherein ld denotes the length of a depletion zone which is formed at the interface between the gate dielectric layer 211 and the body region 220. In this case, the channel regions formed in the ridges at opposing sidewalls 220b of the ridge may physically contact or merge with each other, when, for example, a voltage corresponding to the threshold voltage is applied to the gate terminal.

According to the embodiment, the body region 220 may be fully depleted when the gate electrode is set to an appropriate potential. Such a transistor is also referred to as a "fully depleted" transistor. In such a transistor, an optimal sub-threshold voltage can be achieved and short channel effects may be efficiently suppressed, resulting in improved device characteristics. According to this embodiment, the width of the ridges may be approximately 20 to 130 nm, e.g. 40 to 120 nm along the second direction and parallel to the first main surface 110 of the semiconductor substrate 100.

When the transistor is switched on, e.g. by applying a suitable voltage to the gate electrode 210, a conductive inversion layer 215 (conductive channel) is formed at the boundary between the body region 220 and the gate dielectric layer 211. Accordingly, the transistor is in a conducting state from the source region 201 to the drain region 205. In case of switching off, no conductive inversion layer is formed and the transistor is in a non-conducting state.

The transistor may, for example, withstand a blocking voltage in a range of 0.3 to 10 V, e.g. 1.4 V to approximately 4 V between source region 201 and drain region 205 in an off-state. Currents flowing in an on-state may be up to approximately 1.5 Amperes or more. Due to the special configuration of the body region which has the shape of a ridge, a higher effective channel width may be achieved at a reduced device area. Further, leakage currents may be reduced since short channel effects may be better suppressed. As a result, the effective width of the transistor may be largely increased without increasing the lateral extension of the transistor.

According to an embodiment, the source region 201 may extend to at least 0.5×the depth of the gate trenches 212. As a result, the body region 220 may be connected to the source region 201 over a large extension depth. Thereby, the effective channel width may be further increased. Due to the presence of the body contact portions 225, a low-ohmic contact of the body region 220 to a source terminal 271 via the source contacts 202 is accomplished and a parasitic bipolar transistor may be deteriorated or suppressed.

Due to the specific configuration, according to which the semiconductor device is formed in a well region 150 of the first conductivity type, e.g. a p-type well which is formed in the second layer 140 of the second conductivity type, leakage currents may be prevented from flowing to the substrate. Due to the presence of the buried layer 135 a higher robustness with respect to the first (p-doped) layer 130 may be achieved. For example, when holes are injected from the substrate, the buried layer 135 protects the semiconductor device against the injection of holes.

According to a different interpretation, the switch 2 illustrated in FIGS. 1A to 1C may be understood as a switch 2 comprising a field effect transistor 200 formed in a semiconductor substrate 100 having a first main surface 110. The field effect transistor 200 includes a source contact trench 321 and a drain contact trench 322, each running in a second direction parallel to the first main surface. A conductive material is formed in the source contact trench 321 and in the drain contact trench 322, each being formed in the first main surface. The field effect transistor 200 further comprises gate electrode structures 210 and body regions 220 extending between the source contact trench 321 and the drain contact trench 322. The gate electrode structures 210 and the body regions 220 are arranged in an alternating manner along the second direction, e.g. the y direction. The field effect transistor 200 further comprises a source region 201 electrically connected to the source contact 202 in the source contact trench 321 and adjacent to the body region 220. The field effect transistor 200 further comprises drain regions 205 electrically connected to the drain contact 206 in the drain contact trench 322 and adjacent to the body regions 220. The field effect transistor further comprises a body contact portion 225 adjacent to the source contact groove and electrically connected to the source contact 202 in the source contact trench 321.

The semiconductor device illustrated in FIGS. 1A to 1C may be suitably used as a lateral low voltage power switch or transistor, e.g. as a low-ohmic low voltage switch. For example, the term "low voltage" may refer to source-drain voltages of approximately up to 15V.

Figure 2:
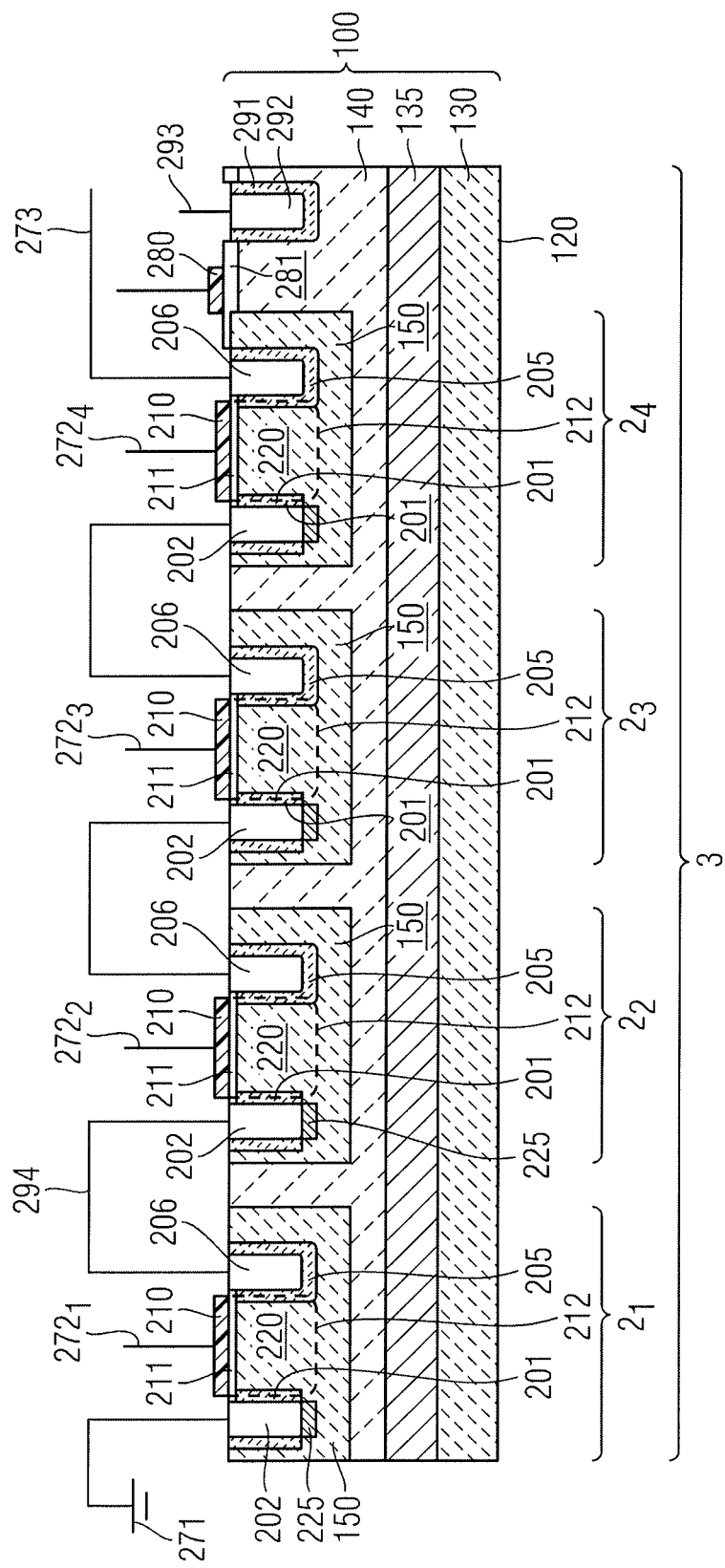
FIG. 2 shows a cross-sectional view of an integrated circuit according to an embodiment.

FIG. 2 shows a cross-sectional view of an integrated circuit according to an embodiment. As is shown, the integrated circuit 3 comprises a plurality of switches $2_1$, $2_2 \ldots 2_4$ that are connected in series. An interconnection line 294 may be disposed between each of the switches $2_1$. For example, the interconnection line 294 may be disposed over the semiconductor substrate 100 or may be disposed within the semiconductor substrate 100. Any of the switches $2_1, \ldots 2_4$ may have a similar construction as the switch 2 illustrated in FIGS. 1A to 10. For example, any of the switches $2_1, \ldots 2_4$ may comprise a source region 201, a drain region 205 and a body region 220.

The body region 220 is disposed along the first direction between the source region 201 and the drain region. The first direction is parallel to the first main surface. The body region 220 has a shape of a ridge that extends along the first direction. The body region 220 is adjacent to the source region 201 and the drain region 205. Each of the switches further comprises a gate electrode 210 that is disposed at the body region 220. The gate electrode 210 may be configured to control a conductivity of channel formed in the body region 220.

The gate electrode 210 is disposed in gate trenches 212 that are indicated by broken lines in FIG. 2. Each of the gate electrodes 210 of the single switches $2_1, \ldots 2_4$ may be separately controlled by applying a corresponding potential to the respective terminal $272_1$, $272_2$, $272_3$ and $272_4$. Each of the switches may further comprise a body contact portion 225 and a source contact 202. The source contact 202 may be electrically connected to a source terminal 271 and the body contact portion 225 may be in contact with the source contact 202 and may be electrically connected to the body region 220. The source region 201 of the first switch $2_1$ may be electrically coupled via the source contact 202 to a source terminal 271 that may correspond to the ground potential. The drain contact 206 of the first switch $2_1$, the second switch $2_2$, and the third switch $2_3$ may be connected to the source contact 202 of the following or next switch $2_2$, $2_3$ or $2_4$. The drain contact 206 of the last switch $2_4$ of the series may be connected to a drain terminal 273.

The semiconductor substrate 100 may comprise a first (bottom) layer 130 of the first conductivity type and an epitaxially grown second layer 140 of the second conductivity type formed over the first layer 130. A further buried layer 135 of the second conductivity type may be disposed between the first layer 130 of the first conductivity type and the second layer 140 of the second conductivity type. The buried layer 135 may be doped at a higher doping concentration than the second layer 140 of the second conductivity type.

According to an embodiment, each of the switches may be disposed in a respective semiconductor substrate portion, and the semiconductor substrate portions may be insulated from each other. For example, the components of the single switches $2_1$, $2_2$, $2_3$, $2_4$ may be formed in isolated first well regions 150 of a first conductivity type, e.g. p-type. The first well regions 150 may be formed in the second semiconductor layer 140 of the second conductivity type. The second layer 140 of the second conductivity type may be contacted via a substrate contact 292. The integrated circuit of FIG. 2 may further comprise a substrate contact 292 that may electrically couple the second layer 140 of the second conductivity type to a contact terminal 293. The substrate contact 292 may be coupled via a doped portion 291 of the second conductivity type to the second semiconductor layer 140 of the conductivity type. By applying an appropriate potential to the contact terminal 293, the pn junction formed between the first well region 150 and second semiconductor layer 140 may be reverse-biased so as to insulate adjacent switches from each other. Further each of the switches is insulated from the buried layer 135 and the components lying beneath the second semiconductor layer 140.

The described isolation scheme according to which each of the switches is formed in a separated first well region 150 is given as an example. According to a further embodiment, this isolation may as well be accomplished using an isolation trench that is filled with insulating material.

Further, the integrated circuit may comprise a field plate 280 that is disposed adjacent to an insulating layer 281 that is formed over the pn junction formed between the second layer 140 of the second conductivity type and the well portion 150 of the first conductivity type. Thereby, electrical fields in the vicinity of the pn junction may be appropriately shaped. In particular, components disposed above the substrate surface may be protected against electrical fields caused by the pn junction.

FIG. 3A shows a cross-sectional view of a system according to an embodiment. The system 4 of FIG. 3A comprises an integrated circuit 3 including similar components as the integrated circuit of FIG. 2. Further, the system of FIG. 3A comprises at least one load $295_1$, $295_2$, $295_3$, $295_4$ that may be connected parallel to any of the switches $2_1$, $2_2$, $2_3$, and $2_4$. According to a particular embodiment, loads $295_1$, $295_2$, $295_3$, $295_4$ may be connected parallel to each of the switches $2_1$, $2_2$, $2_3$, and $2_4$, respectively. For example, the load may be a light emitting element such as an LED ("light emitting diode"), light bulb and others. According to further embodiments, the load may be a resistive element such as a heating resistor.

Due to the special configuration of the system, loads may be selectively short-circuited by setting respective switches $2_1$, $2_2$, $2_3$, and $2_4$ to an ON-state. This may be accomplished by selectively activating the gate electrodes 210 of the respective switches and applying a suitable potential to the gate terminals $272_1$, $272_2$, $272_3$, and $272_4$.

Due to this specific configuration, a specific pattern of activated loads may be generated by suitably arranging the series connection of the switches $2_1, \ldots 2_4$ and by appropriately activating the gate electrodes 210 of the respective switches.

The integrated circuit illustrated in FIG. 3A implements a Multi-Floatswitch in which the potentials applied to the source region 201 and the drain region 205 of every single switch is not fixed but may depend on the switching state of the neighbouring switches. In more detail, when all the switches are set to an ON-state, the potential at the source region 201 and at the drain region 205 may be different from a case in which only some of the switches are set to an ON-state.

Figure 3B:
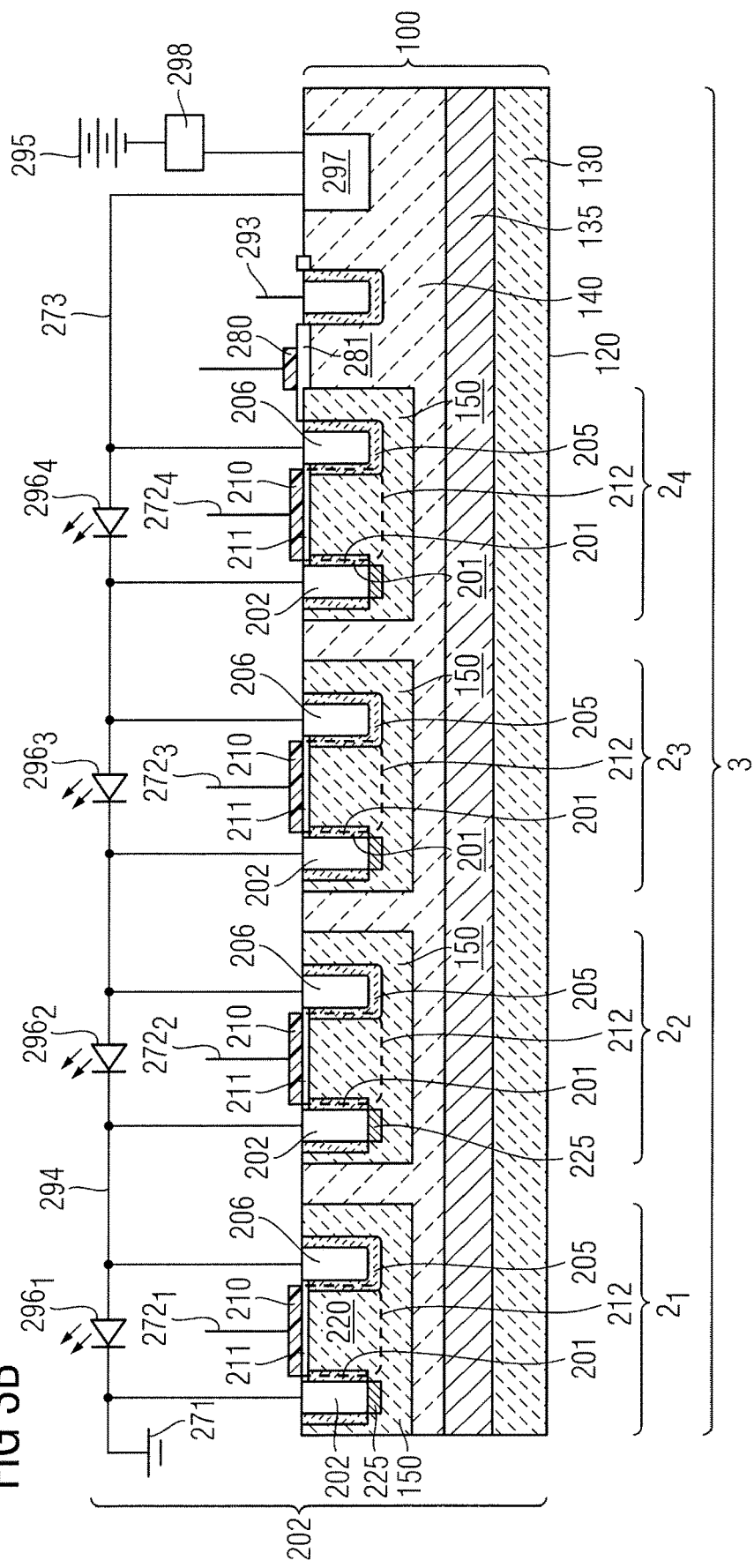
FIG. 3B shows a cross-sectional view of a system according to an embodiment.

FIG. 3B shows a further implementation according to which each of the loads is implemented by an LED $296_1$, $296_2$, $296_3$, $296_4$. As is known, high currents may flow across the LED and may damage the LED. Accordingly, usually, when an LED is connected to battery, a resistor is connected in series with the LED so as to reduce the current. According to an embodiment, instead of reducing the voltage applied to any of the LEDs, the system or the integrated circuit further comprises a DC/DC converter 297 so as to control the voltage applied to the series of LEDs. Due to this arrangement comprising a DC/DC converter instead of a resistor, energy may be saved and less power is dissipated. Further, due to the presence of a DC/DC converter, the applied voltages may be varied in a large range. As a consequence, a chain or series of loads, e.g. LED's comprising a large number of loads may be driven.

Depending on the supply voltage and the number of loads, e.g. LED's and consequently, the voltage required to drive the LED's, the DC/DC converter may be a boost converter, a buck converter or a buck/boost converter. For example, the converter 297 may be a buck-boost converter and may decrease the voltage applied when LED's are switched off (buck). On the other side, the converter 297 may increases the voltage when a plurality of LEDs are switched on (boost).

For example, the converter 297 may be connected in series with a battery 299. According to a further embodiment, the converter 297 may be arranged in the same semiconductor substrate 100 in which the integrated circuit comprising the series connection of switches is formed. Usually, a converter should increase or decrease the voltage at a high speed. Accordingly, a fast communication between converter and the switches $2_1, \ldots 2_4$ is desirable. For example, the converter 297 may be connected to a battery 299 via a high-side switch 298, e.g. a ProFET™. The high-side switch acts as a protective switch.

Due to the specific arrangement shown in FIG. 3B, in which a plurality of switches $2_1, \ldots 2_4$ are connected in series, and further, LEDs $296_1$, $296_4$ are connected parallel to each of the switches $2_1, \ldots 2_4$ a system may be realized having a very small $R_{on} \cdot A$ and a very small area while at the same time providing low leakage currents and a high efficiency.

As has been described, the integrated circuit 3 may comprise the converter 297 and, optionally, the high-side switch 298. According to this embodiment, these components are integrated within the same semiconductor substrate 100. According to a further embodiment, the converter 297 and/or the high-side switch 298 may be formed in different substrates. For example, the integrated circuit 3, the converter 297 and/or the high-side switch 298 may be mounted to the same board 300.

For example, the system 4 described herein may be used in automotive applications. In particular, the system of FIG. 3B may implement a front lighting system of a car. Increasingly, LED lighting solutions are used in the front area of cars. Adaptive lighting systems enable special LED patterns to be generated so as to create a desired illumination pattern. This may be useful, e.g. for illuminating a pedestrian crossing the road, or for preventing an oncoming vehicle from being dazzled. Further, the illumination pattern may be dynamically created, when the road is bending. In case of a car lighting system, a typical supply voltage of the battery may be 12 V. According to an embodiment, the integrated circuit comprising the plurality of switches and the DC/DC converter may supply voltages in a range of 0 V to approximately 70 to 80 V or even more.

The integrated circuit 3 may be used for driving a plurality of LEDs of such a lighting system. Further, the system 4 described herein may implement such a lighting system. As is clearly to be understood, the use of the system and of the integrated circuit is not restricted to car lighting systems. For example, the integrated circuit may also be used in an arbitrary lighting system, in particular, a lighting system, in which illumination patterns are generated. Examples comprise inter alia inspection systems, such as pipe inspection systems, endoscopes, in particular, for medical applications, displays of any kind and illuminated advertisings.

Figure 4:
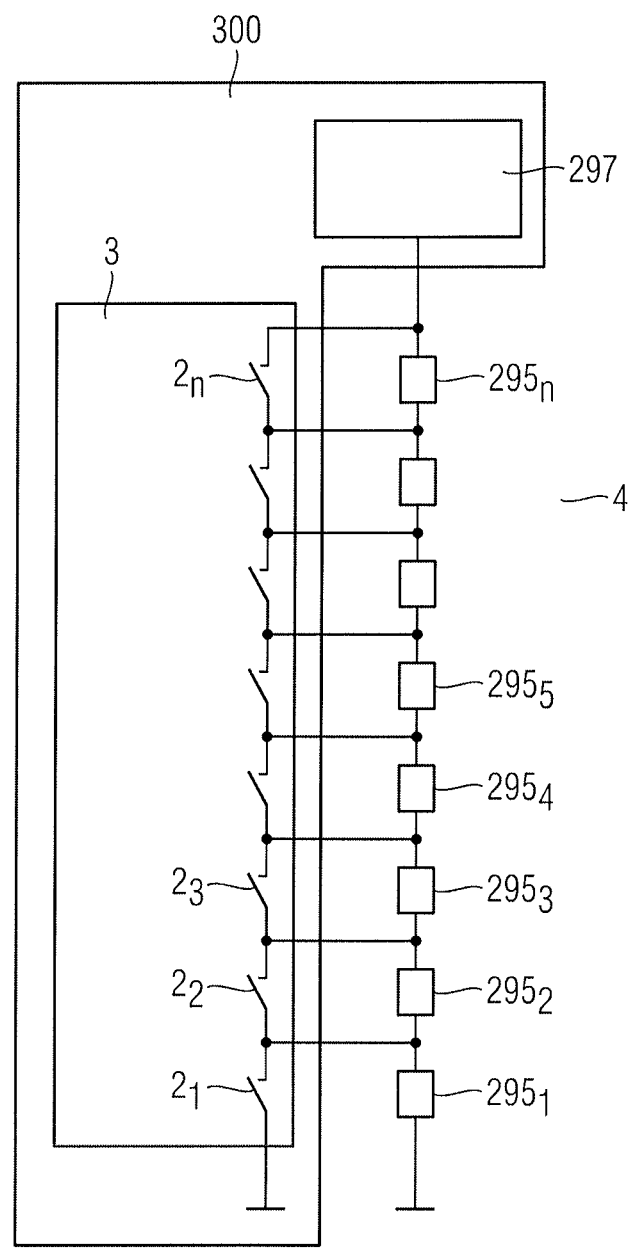
FIG. 4 shows an equivalent circuit diagram of a system according to an embodiment.

FIG. 4 shows an equivalent circuit diagram of a system according to an embodiment. The system comprises an integrated circuit including a plurality of switches $2_1$, $2_n$ that are connected in series. The system, the integrated circuit and the switches may be implemented in the manner as has been explained above with reference to FIGS. 1A to 3B. The system 4 comprises a plurality of loads $295_1, \ldots 295_n$. For example, the loads may be implemented by LEDs. Each of the LEDs is connected parallel to a corresponding one of the switches $2_1 \ldots 2_n$. This circuit is connected to a DC/DC converter 297, e.g. a buck-boost converter. The buck-boost converter 297 is connected to a battery (not illustrated in this drawing). The DC/DC converter 297 and the integrated circuit 3 may be mounted to the same board 300. According to an embodiment, the DC/DC converter 297 may be a component of the integrated circuit 3. In particular, the integrated circuit 3 may comprise the DC/DC converter 297. The chain of loads may be arranged in an arbitrary manner.

Figure 5A:
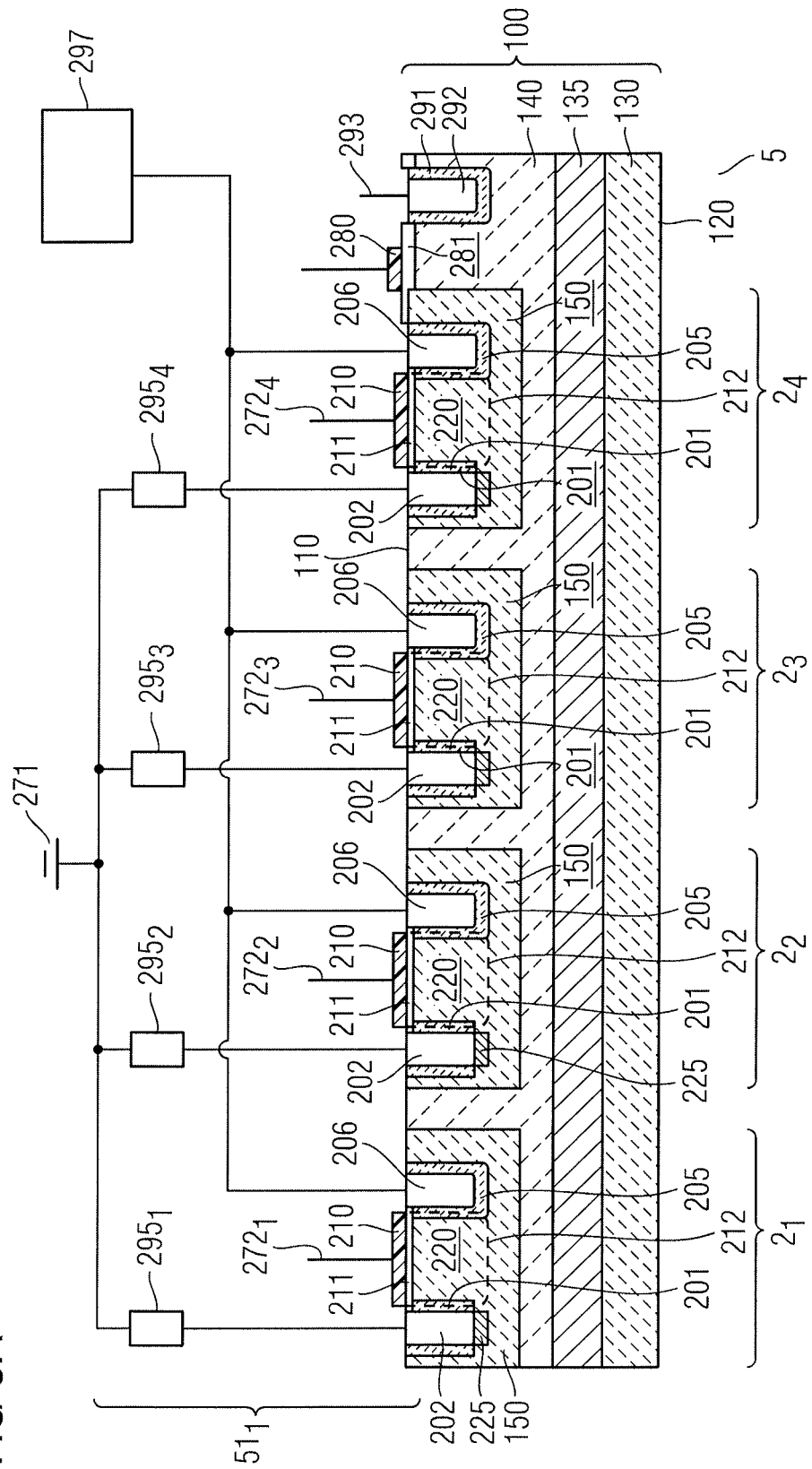
FIG. 5A shows a cross-sectional view of a system according to a further embodiment.

FIG. 5A shows a vertical cross-sectional view of a system 5 according to a further embodiment. The system 5 includes a plurality of basic systems $51_1, 51_2, \ldots 51_n$. For example, the basic systems $51_1, 51_2, \ldots 51_n$ may be connected parallel to each other. Each of the basic systems may comprise a switch as has been discussed above with reference to FIGS. 1A to 1C and a load $295_1, 295_2, \ldots 295_n$. For example, the load may be a light emitting element such as an LED ("light emitting diode"), light bulb and others. According to further embodiments, the load may be a resistive element such as a heating resistor. The switch $2_1, 2_2, \ldots 2_n$ may be connected in series with the load $295_1, 295_2, \ldots 295_n$. By controlling a gate voltage that is applied to the gate electrode 210 of the switch $2_1, 2_2, \ldots 2_n$, the current flowing across the load that is connected in series may be controlled. For example, if the load is a light emitting element, a luminance of the load may be controlled by controlling the gate voltage. As a result, the luminance can be controlled in a cost-efficient manner, since excessive voltage may not be dissipated but decreased.

For example, the system may further comprise a DC/DC converter 297 in the manner as has been described above. According to an embodiment, the DC/DC converter 297 may implement a buck converter that converts the voltage to a lower voltage, depending on a number of loads that are switched on. According to an embodiment, the DC/DC converter 297 and the plurality of switches may be integrated into the same semiconductor substrate 100.

Figure 5B:
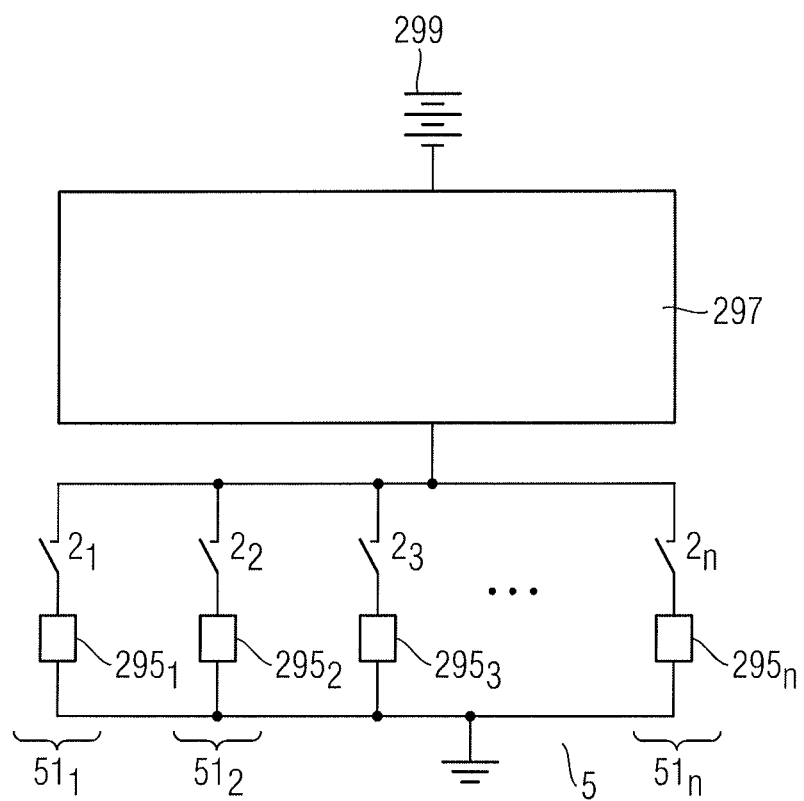
FIG. 5B shows an equivalent circuit diagram of a system according to a further embodiment.

FIG. 5B illustrates an equivalent circuit diagram of the system 5 that has been described above.

The basic system $51_1, 51_2, \ldots 51_n$ or the system 5 described with reference to FIGS. 5A and 5B may be used in a lighting system, for example, an automotive lighting system. As is to be clearly understood, the basic system or the system may be used in a variety of different applications.

While embodiments of the invention have been described' above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. An apparatus comprising:
   a switch comprising a field effect transistor in a semiconductor substrate having a first main surface, the field effect transistor comprising:
   a source region;
   a drain region;
   a drain contact arranged in a drain contact trench formed in the first main surface, the drain region being directly adjacent to the drain contact;
   a body region being disposed along a first direction between the source region and the drain region, the first direction being parallel to the first main surface, the body region having a shape of a ridge extending along the first direction, and the body region being directly adjacent to the source region and directly adjacent to the drain region;
   a gate electrode at the body region, the gate electrode being configured to control a conductivity of a channel formed in the body region, the gate electrode being disposed in gate trenches;
   a source contact arranged in a source contact trench formed in the first main surface, the source contact being electrically connected to a source terminal; and
   a body contact portion being in contact with the source contact and being electrically connected to the body region.

2. The apparatus according to claim 1, wherein the apparatus is formed as an integrated circuit, and wherein the integrated circuit comprises a plurality of switches, the switches being connected in series.

3. The apparatus according to claim 2, wherein each of the switches is disposed in a respective substrate portion, the substrate portions being insulated from each other.

4. The apparatus according to claim 2, wherein the semiconductor substrate comprises a doped layer of a second conductivity type and a plurality of first well regions of a first conductivity type disposed in the doped layer, the plurality of first well regions being insulated from each other.

5. The apparatus according to claim 4, wherein first well regions of the plurality of first well regions are insulated from each other by pn-junctions.

6. The apparatus according to claim 2, further comprising a load that is connected in parallel to one of the switches.

7. The apparatus according to claim 6, wherein the load is selected from the group consisting of a light emitting element, a LED (light emitting diode), a light bulb, a resistive element and a heating resistor.

8. The apparatus according to claim 6, further comprising a DC/DC converter.

9. The apparatus according to claim 8, wherein the DC/DC converter is a buck-boost converter.

10. The apparatus according to claim 8, wherein the plurality of switches and the DC/DC converter are integrated into one semiconductor substrate.

11. The apparatus according to claim 2, wherein the integrated circuit is formed as part of an automatic lighting system.

12. The apparatus according to claim 1, further comprising a DC/DC converter.

13. The apparatus according to claim 12, wherein the DC/DC converter is a buck-boost converter.

14. The apparatus according to claim 1, wherein the switch is disposed in a lighting system.

15. The apparatus according to claim 1, further comprising a load connected in series to the switch.

16. The apparatus according to claim 15, wherein the load is selected from the group consisting of a light emitting element, a LED (light emitting diode), a light bulb, a resistive element and a heating resistor.

17. The apparatus according to claim 15, further comprising at least one additional switch connected to one additional load connected in parallel to the switch and the load.

18. The apparatus according to claim 17, further comprising a DC/DC converter.

19. The apparatus according to claim 18, wherein the DC/DC converter and the switch and the at least one additional switch are integrated into one semiconductor substrate.

20. An apparatus comprising:
   an integrated circuit comprising a plurality of switches connected in series, at least one of the switches comprising a field effect transistor in a semiconductor substrate having a first main surface, the field effect transistor comprising:
   a source region;
   a source contact arranged in a source contact trench formed in the first main surface, the source region being directly adjacent to the source contact;
   a drain region;
   a drain contact arranged in a drain contact trench formed in the first main surface, the drain region being directly adjacent to the drain contact;

a body region being disposed along a first direction between the source region and the drain region, the first direction being parallel to the first main surface; and a gate electrode at the body region, the gate electrode being configured to control a conductivity of a channel formed in the body region, the gate electrode being disposed in gate trenches extending along the first direction, wherein the body region is patterned into a ridge by the gate trenches, and wherein the body region is directly adjacent to the source region and directly adjacent to the drain region.

21. The apparatus according to claim 20, wherein the semiconductor substrate comprises a doped layer of a second conductivity type and a plurality of first well regions of a first conductivity type disposed in the doped layer, the plurality of first well regions being insulated from each other.

22. The apparatus according to claim 20, further comprising a DC/DC converter.

23. The apparatus according to claim 22, wherein the DC/DC converter is a buck-boost converter.

24. The apparatus according to claim 20, further comprising a load that is connected in parallel to one of the switches.

25. The apparatus according to claim 24, wherein the load is selected from the group consisting of a light emitting element, a LED (light emitting diode), a light bulb, a resistive element and a heating resistor.

* * * * *